(12) United States Patent
Lee et al.

(10) Patent No.: US 11,502,129 B2
(45) Date of Patent: Nov. 15, 2022

(54) THREE-DIMENSIONAL SEMICONDUCTOR INTEGRATED CIRCUIT

(71) Applicant: Research & Business Foundation Sungkyunkwan University, Suwon-si (KR)

(72) Inventors: Sungjoo Lee, Seongnam-si (KR); Jae Hyeok Ju, Changwon-si (KR); Jin-Hong Park, Hwaseong-si (KR); Sungpyo Baek, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 17/175,839

(22) Filed: Feb. 15, 2021

(65) Prior Publication Data
US 2021/0257412 A1  Aug. 19, 2021

(30) Foreign Application Priority Data

Feb. 13, 2020  (KR) .................. 10-2020-0017291

(51) Int. Cl.
*H01L 27/24* (2006.01)
*H01L 45/00* (2006.01)

(52) U.S. Cl.
CPC ........ *H01L 27/2463* (2013.01); *H01L 45/085* (2013.01); *H01L 45/1233* (2013.01); *H01L 45/1266* (2013.01); *H01L 45/146* (2013.01); *H01L 45/1683* (2013.01)

(58) Field of Classification Search
CPC .............. H01L 27/2463; H01L 45/085; H01L 45/1233; H01L 45/1266; H01L 45/146; H01L 45/1683
See application file for complete search history.

(56) References Cited

U.S. PATENT DOCUMENTS

2012/0063194 A1*  3/2012  Baek .................. H01L 45/147
257/E45.002

FOREIGN PATENT DOCUMENTS

| KR | 10-0676451 B1 | 1/2007 |
| KR | 10-2015-0067730 A | 6/2015 |
| KR | 10-2069239 B1 | 2/2020 |

OTHER PUBLICATIONS

Ju et al., High performance bi-layer atomic switching devices, Nanoscale, 2017, 9, 8373-8379 (Year: 2017).*

* cited by examiner

*Primary Examiner* — Shih Tsun A Chou
(74) *Attorney, Agent, or Firm* — NSIP Law

(57) ABSTRACT

A three-dimensional semiconductor integrated circuit includes a first CMOS circuit layer including a plurality of first CMOS circuit blocks; an insulating layer disposed on a top of the first CMOS circuit layer; a plurality of atomic switching elements respectively disposed inside via holes extending through the insulating layer, wherein the plurality of atomic switching elements are electrically connected to the plurality of first CMOS circuit blocks, respectively; a driver circuit layer disposed on a top of the insulating layer, and electrically connected with the atomic switching elements, wherein the driver circuit layer include a driver circuit for selectively turning on and off the atomic switching elements; and a second CMOS circuit disposed on a top of the driver circuit layer and connected to the atomic switching elements.

12 Claims, 9 Drawing Sheets

| | Output Voltage | Power consumption |
|---|---|---|
| Atomic Switch X (Comparative Example) |  | 0.3 mW (12 Hz) |
| Atomic Switch OFF (Example 1) |  | 23.4 mW |

THREE-DIMENSIONAL SEMICONDUCTOR INTEGRATED CIRCUIT

CROSS-REFERENCE TO RELATED APPLICATIONS

This application claims the benefit under 35 USC 119(a) of Korean Patent Application No. 10-2020-0017291 filed on Feb. 13, 2020, in the Korean Intellectual Property Office, the entire disclosure of which is incorporated herein by reference for all purposes.

BACKGROUND

1. Field

The present disclosure relates to a three-dimensional semiconductor integrated circuit in which a CMOS circuit block may selectively activated using an atomic switching element.

2. Description of Related Art

Three-dimensional semiconductor integrated structures can roughly include two parts, a front-end-of-line (FEOL) having a semiconducting channel layer and a transistor and a back-end-of-line (BEOL) having a wire on the FEOL. The FEOL and the BEOL constitute one tier, and tiers constitute a three-dimensional semiconductor structure by being vertically stacked in a monolithic three-dimensional form using a through-silicon via (TSV).

The semiconductor device has been miniaturized according to Moore's Law to improve its performance, and the FEOL has been developed to reduce a process cost. As a line width of a transistor is decreased, since a degree of the process difficulty and thermal density be increased, it is running up against technical limitations for developing the FEOL.

Particularly, as the line width of the wire is reduced below about 250 nm, the development of the BEOL may hold a dominant position, compared to the development of the FEOL.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a three-dimensional semiconductor integrated circuit in which a CMOS circuit block may be selectively activated using an atomic switching element.

Another purpose of the present disclosure is to provide a power-gating semiconductor device or a neuromorphic semiconductor device including the three-dimensional semiconductor integrated circuit.

Another purpose of the present disclosure is to provide a method for integrating an atomic switching element inside a via of the three-dimensional semiconductor integrated circuit.

Purposes in accordance with the present disclosure are not limited to the above-mentioned purpose. Other purposes and advantages in accordance with the present disclosure as not mentioned above may be understood from following descriptions and more clearly understood from embodiments in accordance with the present disclosure. Further, it will be readily appreciated that the purposes and advantages in accordance with the present disclosure may be realized by features and combinations thereof as disclosed in the claims.

According to the present disclosure, it is possible to implement a new function and improve a performance of the BEOL of the semiconductor device through integrating the active atomic switching element, which is a switching element, in a via-interconnection which was functioned as a passive wire for transferring an electrical signal.

A first aspect of the present disclosure provides a three-dimensional semiconductor integrated circuit including a first CMOS circuit layer including a plurality of first CMOS circuit blocks; an insulating layer disposed on a top of the first CMOS circuit layer; a plurality of atomic switching elements respectively disposed inside via holes extending through the insulating layer, wherein the plurality of atomic switching elements are electrically connected to the plurality of first CMOS circuit blocks, respectively; a driver circuit layer disposed on a top of the insulating layer, and electrically connected with the atomic switching elements, wherein the driver circuit layer include a driver circuit for selectively turning on and off the atomic switching elements; and a second CMOS circuit disposed on a top of the driver circuit layer and connected to the atomic switching elements.

In one implementation of the first aspect, the driver circuit includes: a driving voltage generator for generating a voltage for turning on and off the atomic switching element; and a selector for selectively electrically connecting at least one of the atomic switching elements to the driving voltage generator.

In one implementation of the first aspect, the driver circuit further includes a selection information receiver for receiving selection information for selecting the at least one atomic switching element from an external component and for providing the selection information to the selector.

In one implementation of the first aspect, the atomic switching element includes: a non-active electrode made of a first metal; an active electrode spaced from and opposite to the non-active electrode, wherein the active electrode is made of a second metal having lower ionization energy than ionization energy of the first metal; and a solid electrolyte layer disposed between the non-active electrode and the active electrode.

In one implementation of the first aspect, the solid electrolyte layer is deposited in a form of a thin film on an inner face of the via hole.

In one implementation of the first aspect, the first metal includes at least one selected from a group consisting of platinum (Pt), palladium (Pd), titanium nitride (TiN), and tungsten (W).

In one implementation of the first aspect, the second metal includes at least one selected from a group consisting of copper (Cu), silver (Ag), and aluminum (Al).

In one implementation of the first aspect, the solid electrolyte layer is made of at least one selected from a group consisting of tantalum pentoxide ($Ta_2O_5$), aluminum oxide ($Al_2O_3$), and hafnium oxide ($HfO_2$).

A second aspect of the present disclosure provides a power gating semiconductor device including the three-dimensional integrated circuit.

A third aspect of the present disclosure provides a neuromorphic semiconductor device including the three-dimensional integrated circuit.

A fourth aspect of the present disclosure provides a method for integrating an atomic switching element inside a via of a three-dimensional semiconductor integrated circuit, the method including forming a non-active electrode made of a first metal on a first CMOS circuit block; forming an insulating layer on each of a top face and both opposing side faces of the first CMS circuit block on which the non-active electrode has been formed; defining a through-hole in the insulating layer; depositing a solid electrolyte layer in a form of a thin film on an inner face of the through-hole; and forming an active electrode on the solid electrolyte layer, wherein the active electrode is made of a second metal having a lower ionization energy than an ionization energy of the first metal.

In one implementation of the fourth aspect, the through-hole is formed using a photolithography process.

The three-dimensional semiconductor integrated circuit in accordance with the present disclosure includes the driver circuit layer that selectively turns on and off the atomic switching elements. Thus, only the CMOS circuit block connected to the selected atomic switching element may be activated, but other circuit blocks are not activated, such that power consumption during circuit standby may be reduced.

Further, according to the present disclosure, a signal may be transferred between the CMOS circuit block connected to the selected atomic switching element and the CMOS circuit disposed above the CMOS circuit block. The atomic switching element may act as a power gating element via selective switching of external power supplies, such that the standby power may be reduced.

In addition, in the three-dimensional semiconductor integrated circuit according to the present disclosure, each of the plurality of atomic switching elements is disposed inside each of the via holes. In particular, the solid electrolyte layer is deposited in a form of a thin film on an inner face of the via hole. Thus, the functional element may be integrated without occupying an additional silicon area. A size of the conductive filament is uniformly controlled, thereby improving operating characteristics of the atomic switching element.

Moreover, the effect of the present disclosure is not limited to the above effects. It should be understood to include all possible effects derived from descriptions of the present disclosure or a configuration as set forth in the claims.

DETAILED DESCRIPTION

For simplicity and clarity of illustration, elements in the drawings are not necessarily drawn to scale. The same reference numbers in different drawings denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
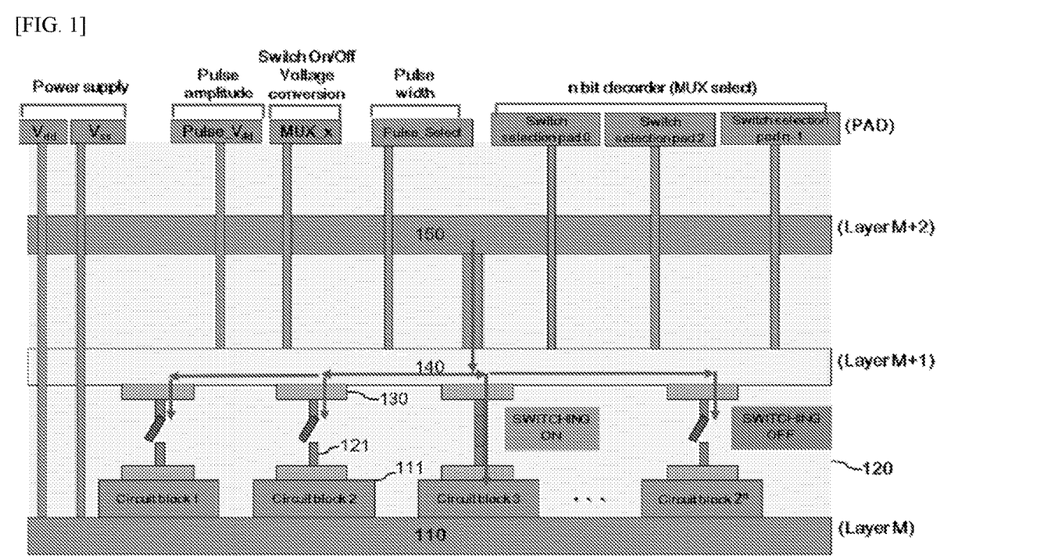
FIG. 1 is a cross-sectional view for illustrating a three-dimensional semiconductor integrated circuit according to one implementation of the present disclosure.

FIG. 1 is a cross-sectional view for illustrating a three-dimensional semiconductor integrated circuit according to one implementation of the present disclosure.

Referring to FIG. 1, a three-dimensional semiconductor integrated circuit according to one implementation of the present disclosure includes a first CMOS circuit layer 110, an insulating layer 120, a plurality of atomic switching elements 130, a driver circuit layer 140, and a second CMOS circuit 150.

The first CMOS circuit layer 110 may include a plurality of first CMOS circuit blocks 111. An insulating layer 120 is disposed thereon. These first CMOS circuit blocks 111 are electrically connected to atomic switching elements 130, respectively.

The insulating layer 120 is disposed on a top of the first CMOS circuit layer 110, and is disposed under the driver circuit layer 140. Via holes 121 are formed in the insulating layer 120 and extend through the insulating layer 120.

The atomic switching element 130 is disposed inside the via hole 121 extending through the insulating layer 120. Each of the atomic switching elements 130 is electrically connected to each of the first CMOS circuit blocks 110. Therefore, only a first CMOS circuit block 110 connected to an atomic switching element 130 activated by the driver circuit layer 140 is selectively activated.

The driving circuit layer 140 is disposed on a top of the insulating layer 120, and is disposed under the second CMOS circuit 150. The driving circuit layer 140 includes a driver circuit that is electrically connected to the atomic switching elements 130 and selectively turns on and off the atomic switching elements 130.

The second CMOS circuit 150 is disposed on a top of the driver circuit layer 140, and is connected to the atomic switching elements 130. In this connection, the second CMOS circuit 150 is embodied as a single circuit block.

Specifically, the second CMOS circuit 150 is electrically connected to a first CMOS circuit block 111 connected to a selected atomic switching element 130. Thus, a signal may be communicated between the second CMOS circuit 150 and the first CMOS circuit block 111 connected to the selected atomic switching element 130.

Figure 2:
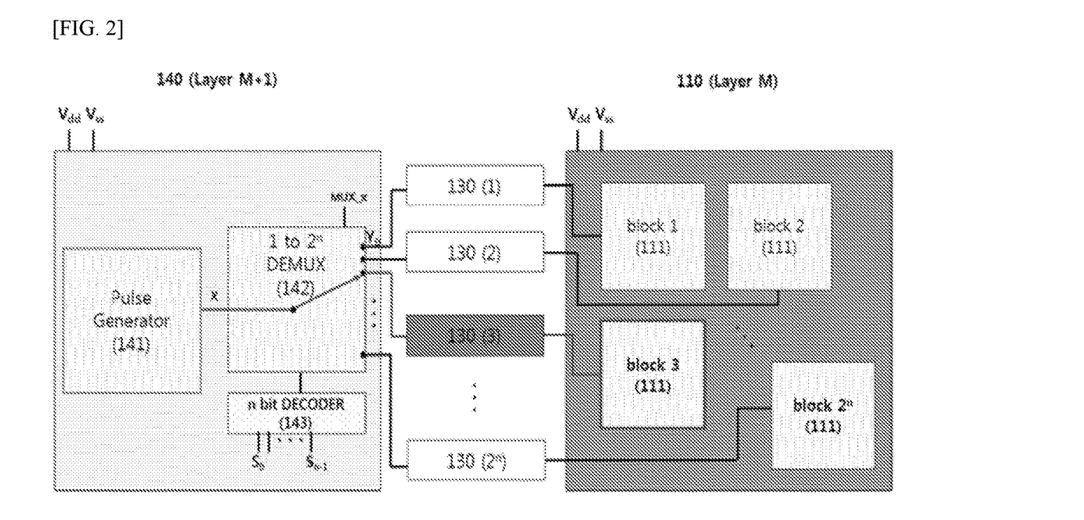
FIG. 2 is a cross-sectional view for illustrating a driver circuit layer according to an implementation of the present disclosure.

In an embodiment, referring to FIG. 2, the driver circuit may include a driving voltage generator 141, a selector 142, and a selection information receiver 143.

The driving voltage generator 141 generates a voltage for turning on and off the atomic switching element 130, and may be, for example, a pulse generator, but is not limited thereto.

In this connection, the driving voltage generator 141 is powered by external power supplies Vdd and Vss as shown in FIG. 2. The driving voltage generator 141 may be controlled by Pulse_Vdd which sets a pulse amplitude, MUX_x which turns the generated voltage on/off, and Pulse_Select which sets a pulse duration.

The selector 142 selectively electrically connects at least one of the atomic switching elements 130 to the driving voltage generator 141. In this connection, selection information may be received from the selection information receiver 143 to be described later.

Therefore, only a selected atomic switching elements 130 is turned on. A circuit block 111 connected to the selected atomic switching element 130 is activated, but other circuit blocks 111 are not activated, thereby reducing leakage current during circuit standby.

That is, as shown in FIGS. 1 and 2, when the selector 142 receives the selection information from the selection information receiver 143 and electrically connects only an atomic switching element 130 selected based on the selection information to the driving voltage generator 141 such that only a circuit block 111 connected to the selected atomic switching element 130 is activated. On the contrary, a drive signal is not supplied to the circuit blocks 111 connected to off-state atomic switching elements 130 which in turn are not activated.

Accordingly, a signal may be transmitted only between the circuit block 111 connected to the selected atomic switching element 130 and the second CMOS circuit 150.

Figure 3:
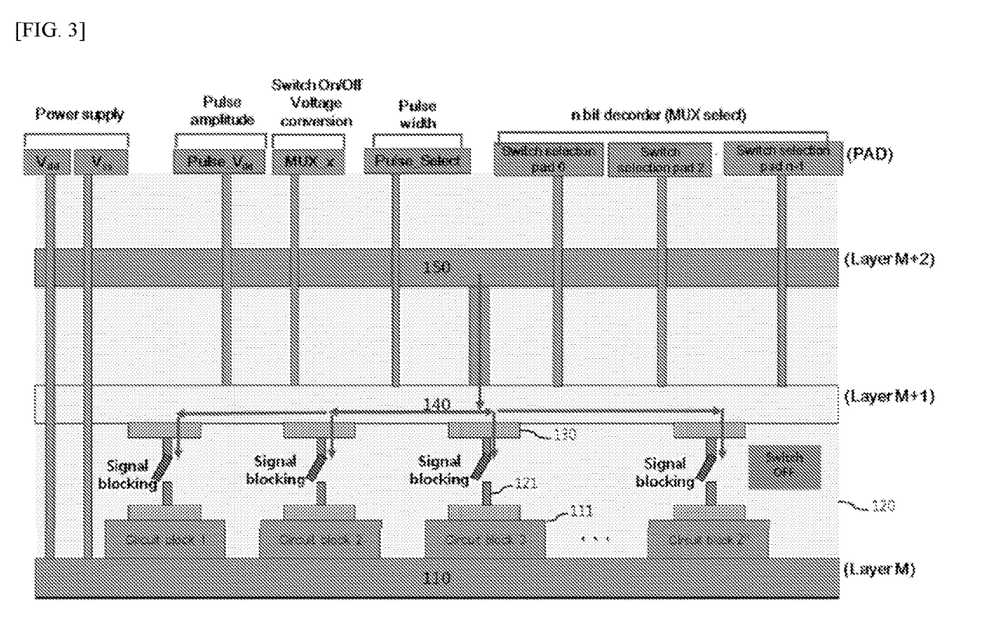
FIG. 3 is a cross-sectional view for illustrating a three-dimensional semiconductor integrated circuit according to one implementation of the present disclosure.

Further, as shown in FIG. 3, when all of atomic switching elements 130 are turned off, a signal required for activation of all of the circuit blocks 111 is blocked, so that the first CMOS circuit layer 110 is not activated, and thus, a signal of the second CMOS circuit 150 is also blocked.

Referring back to FIG. 2, the selection information receiver 143 is configured to receive the selection information for selecting the at least one atomic switching element 130 from an outside and provide the selection information to the selector 142. The selection information may be a signal input from a pad including an external circuit (see FIG. 1).

Figure 4:
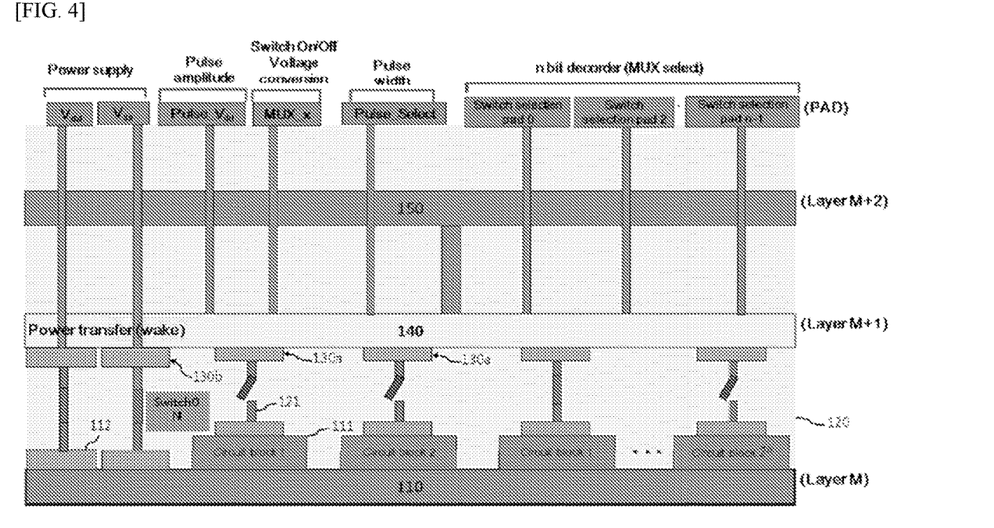
FIGS. 4 and 5 are cross-sectional views for illustrating a three-dimensional semiconductor integrated circuit according to another embodiment of the present disclosure.
Figure 5:
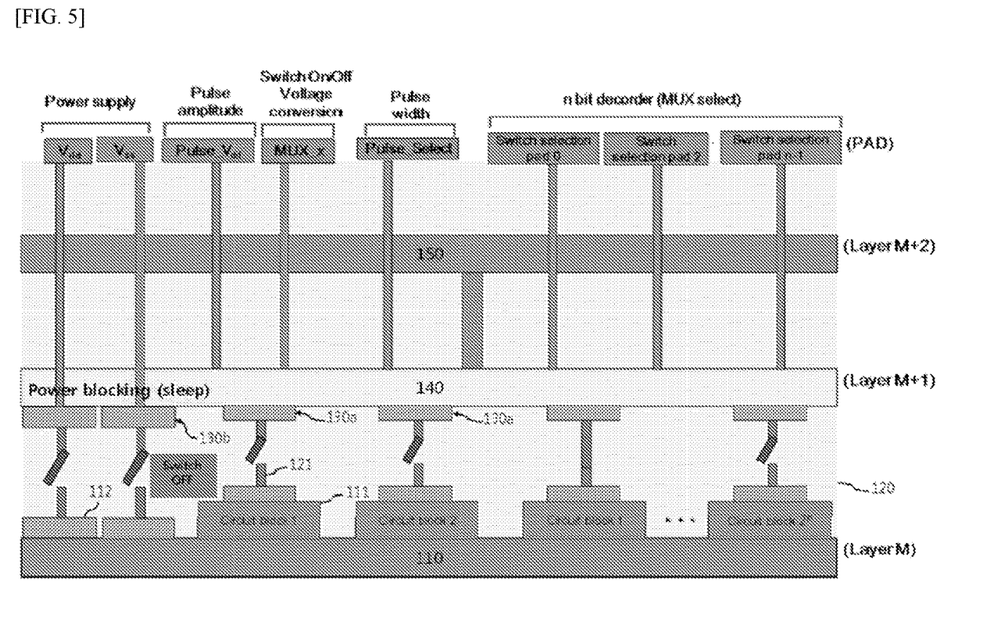

FIGS. 4 and 5 are cross-sectional views for illustrating a three-dimensional semiconductor integrated circuit according to another embodiment of the present disclosure.

Referring to FIGS. 4 and 5, a three-dimensional semiconductor integrated circuit according to another embodiment of the present disclosure includes a first CMOS circuit layer 110, an insulating layer 120, a plurality of atomic switching elements 130, a driver circuit layer 140, and a second CMOS circuit 150. In this connection, descriptions of the same component as those as described above are omitted.

The first CMOS circuit layer 110 further includes a power terminal 112 in addition to the plurality of first CMOS circuit block 111. The atomic switching elements 130 further includes a second atomic switching element 130b electrically connected to each power terminal 112 and each of the external power supplies Vdd and Vss, in addition to the plurality of first atomic switching elements 130a electrically connected to the first CMOS circuit blocks 111, respectively.

Each second atomic switching element 130b is disposed inside the via hole 121 extending through the insulating layer 120, and is electrically connected to each power terminal 112 and each of the external power supplies Vdd and Vss.

Therefore, as shown in FIG. 4, when the driver circuit layer 140 turns on the second atomic switching element 130b, a corresponding one of the external power supplies Vdd and Vss and a corresponding power terminal 112 are electrically connected to each other to supply power to the first CMOS circuit layer 110.

On the contrary, as shown in FIG. 5, when the driver circuit layer 140 turns off the second atomic switching element 130b, power supply from the corresponding one of the external power supplies Vdd and Vss is cut off and thus the voltage is not applied to the first CMOS circuit layer 110.

In this connection, the selector 142 of the driver circuit layer 140 may receive on/off information of the second atomic switching element 130b from the selection information receiver 143, and may selectively connect the second atomic switching element 130b to the driver voltage generator 141 based on the on/off information, thereby controlling power supply to the first CMOS circuit layer 110.

Therefore, the second atomic switching element 130b may act as a power gating element via selective switching of the external power supplies Vdd and Vss, such that standby power may be reduced.

Figure 6:
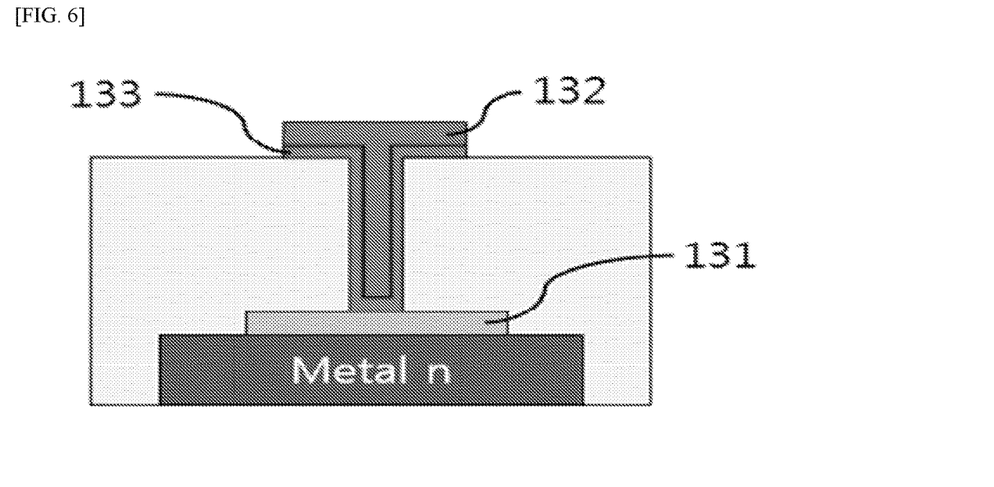
FIG. 6 is a cross-sectional view for illustrating an atomic switching element according to an implementation of the present disclosure.

The atomic switching element 130 applicable to various embodiments as described above may include a non-active electrode 131, an active electrode 132, and a solid electrolyte layer 133 (see FIG. 6).

The non-active electrode 131 and the active electrode 132 may be spaced from each other and may be opposite to each other, while the solid electrolyte layer 133 may be disposed between the non-active electrode 131 and the active electrode 132.

Thus, when an operating voltage is applied across the non-active electrode 131 and the active electrode 132 and an electric field is generated therebetween, metal of the active electrode 132 is ionized and ions are moved to an inside of the solid electrolyte layer 133, and then reduced therein to form a conductive filament through which current may flow inside the solid electrolyte layer 133. Then, the conductive filament may be destroyed when a reset voltage is applied across the active electrode 132 and the non-active electrode 131.

In this connection, the solid electrolyte layer 133 is preferably deposited in a form of a thin film on an inner face of via hole 121. Due to this structure, a size of the conductive filament is uniformly controlled, so that the operation characteristics of the atomic switching element 130 may be improved.

In one example, in order to supply metal ions into the solid electrolyte layer 133 even at a low operating voltage, the active electrode 132 may be made of a metal material with low ionization energy and excellent electrical conductivity. For example, the active electrode 132 may be made of copper (Cu), silver (Ag), aluminum (Al), or the like.

The non-active electrode 131 may be made of a metal material having higher ionization energy than that of the metal of the active electrode 132, and excellent electrical conductivity. For example, the non-active electrode 132 may be made of platinum (Pt), palladium (Pd), titanium nitride (TiN), tungsten (W), or the like.

The solid electrolyte layer 133 may be made of an oxide of a metal having a valence of 2 or greater. In one implementation, the solid electrolyte layer 133 may be made of, for example, tantalum pentoxide ($Ta_2O_5$), aluminum oxide ($Al_2O_3$), hafnium oxide ($HfO_2$), and the like.

The three-dimensional semiconductor integrated circuit in accordance with the present disclosure includes the driver circuit layer 140 that selectively turns on and off the atomic switching elements 130. Thus, only the first CMOS circuit block 111 connected to the selected atomic switching element 230 may be activated, but other first circuit blocks 111 are not activated, such that power consumption during circuit standby may be reduced.

Further, according to the present disclosure, a signal may be transferred between the first CMOS circuit block 111 connected to the selected atomic switching element 130 and the second CMOS circuit 150 disposed above the first CMOS circuit blocks 111. The second atomic switching element 130b may act as a power gating element via selective switching of the external power supplies Vdd and Vss, such that the standby power may be reduced.

In addition, in the three-dimensional semiconductor integrated circuit according to the present disclosure, each of the plurality of atomic switching elements 130 is disposed inside each of the via holes 121. In particular, the solid electrolyte layer 143 is deposited in a form of a thin film on an inner face of the via hole 121. Thus, the functional element may be integrated without occupying an additional silicon area. A size of the conductive filament is uniformly controlled, thereby improving operating characteristics of the atomic switching element 130.

Further, in another embodiment of the present disclosure, a neuromorphic semiconductor device including the three-dimensional semiconductor integrated circuit may be provided. In one implementation, a neuromorphic system may be implemented using the neuromorphic semiconductor device including the three-dimensional semiconductor integrated circuit. Digital switching characteristic (that is, current increases rapidly at a specific operating voltage value such that switch from an off state to an on state occurs) of the atomic switching element 130 may mimic firing behavior of neuromorphic neurons. The analog switching characteristic (that is, conductance of the element continuously increases as the voltage increases) thereof may mimic the operation of a neuromorphic synaptic element.

Figure 7:
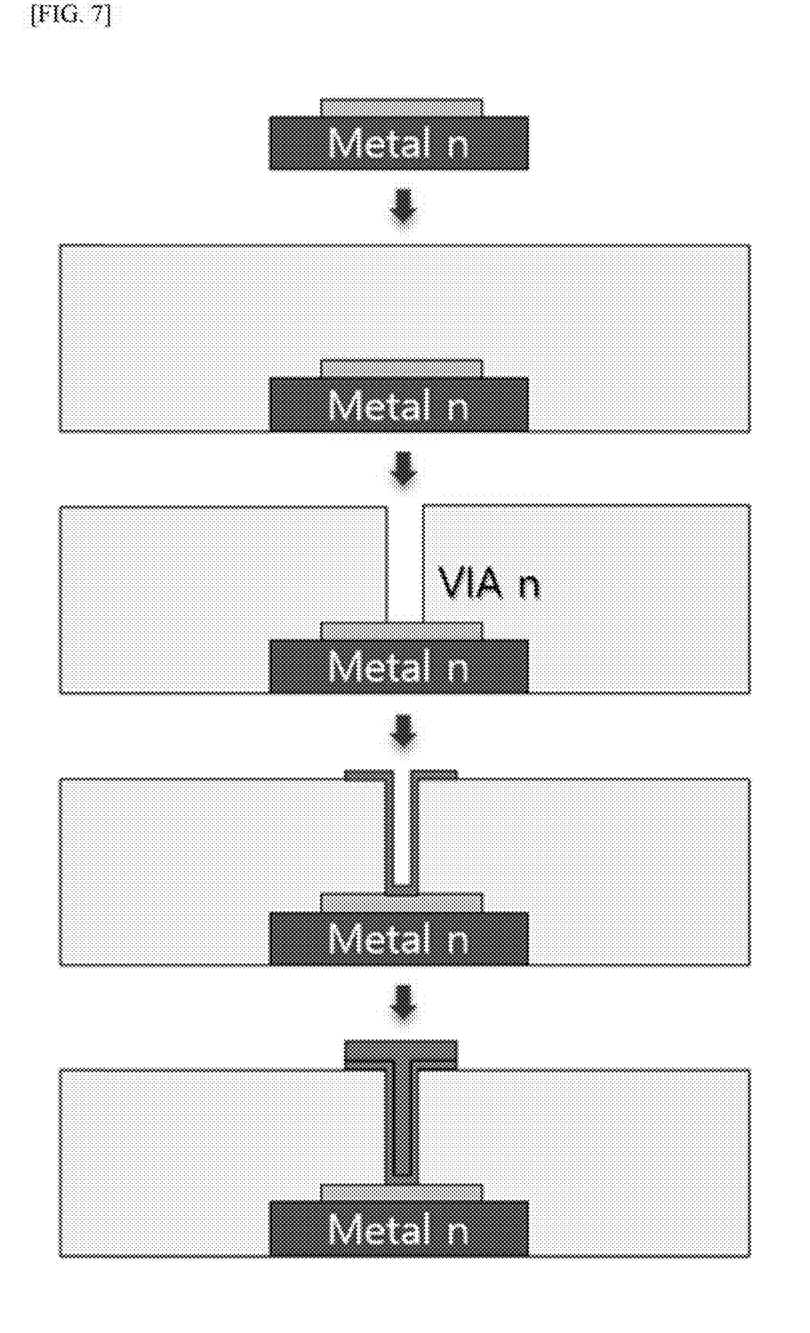
FIG. 7 is a schematic diagram showing a method for integrating an atomic switching element inside a via of a three-dimensional semiconductor integrated circuit according to an implementation of the present disclosure.

In another embodiment, referring to FIG. 7, the present disclosure provides a method for integrating an atomic switching element inside a via of a three-dimensional semiconductor integrated circuit.

The method includes forming a non-active electrode made of a first metal on a first CMOS circuit block; forming an insulating layer on each of a top face and both opposing side faces of the first CMS circuit block on which the non-active electrode is formed; forming a through-hole in the insulating layer; depositing a solid electrolyte layer in a form of a thin film on an inner face of the through-hole; and forming an active electrode on the solid electrolyte layer, wherein the active electrode is made of a second metal having a lower ionization energy than an ionization energy of the first metal.

First, a step of forming the non-active electrode made of the first metal on the first CMOS circuit block is performed.

In this connection, the non-active electrode may be formed using a deposition method such as E-beam, sputtering, atomic layer deposition (ALD), etc., but is not limited thereto.

Next, a step of forming the insulating layer on the top and both opposing side faces of the first CMOS circuit block on which the non-active electrode is formed is carried out. Then, the through-hole may be defined in the insulating layer/

In this connection, the through-hole is preferably formed via a photolithography process, but is not limited thereto. The through-hole may define the via.

Then, a step of depositing the solid electrolyte layer in the form of the thin film in the through-hole, that is, on an inner face of the via hole is performed. Thereafter, a step of forming the active electrode made of a second metal having lower ionization energy than that of the first metal on the solid electrolyte layer is executed. Thus, the atomic switching element may be integrated inside the via of the three-dimensional semiconductor integrated circuit.

In this connection, the solid electrolyte layer and the active electrode may also be formed via deposition methods such as E-beam, sputtering, and atomic layer deposition (ALD), but is not limited thereto.

When integrating the atomic switching element inside the via the above method, the functional element may be integrated without occupying an additional silicon area.

Hereinafter, Examples of the present disclosure will be described in detail. However, the following Examples are only some embodiments of the present disclosure, and the present disclosure should not be construed as being limited to the following Examples.

EXAMPLES

After forming a photoresist pattern on a CMOS circuit block, a Ti/Pt non-active electrode was deposited via sputtering thereon, followed by a lift-off.

Then, a pe-teos insulating layer was formed on the top and both side faces of the CMOS circuit block on which the non-active electrode was formed. After forming the via therein using photolithography and etching, an $Al_2O_3$ solid electrolyte layer and a photoresist pattern of active electrode were formed. The solid electrolyte layer was deposited on the inner surface of the via in the form of a thin film using ALD. A copper active electrode was deposited thereon via sputtering. In this manner, the atomic switching element was integrated inside the via.

Example 1

Figure 8:
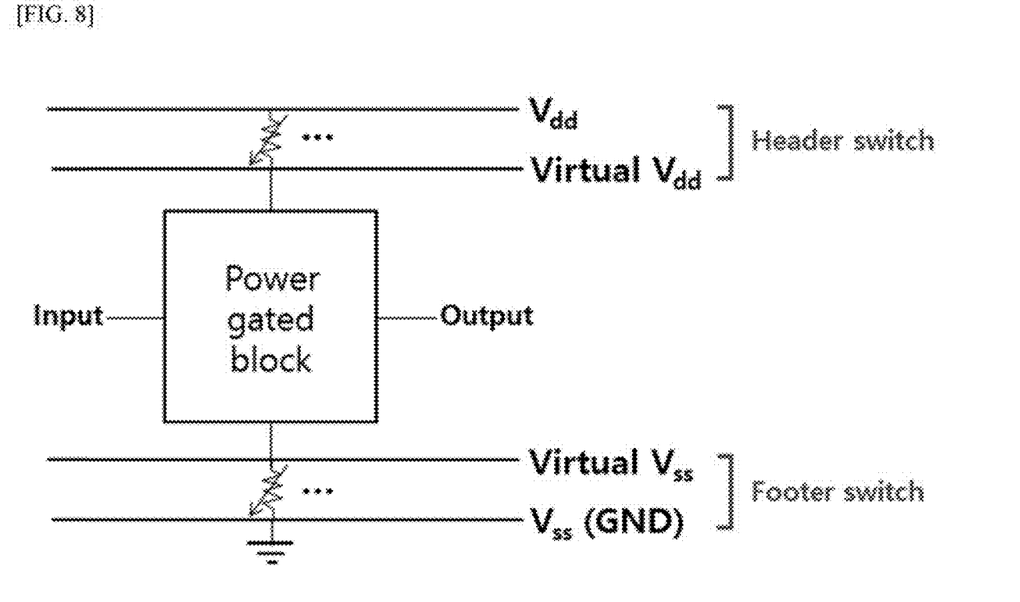
FIG. 8 is a diagram showing a circuit diagram in which an atomic switching element is integrated in a via interconnection connected to an external power supplies Vdd and Vss of a ring oscillator according to Example 1 of the present disclosure.

To evaluate the power consumption of the circuit, the atomic switching element was integrated in an via interconnection connected to a 21 stage ring oscillator and each of the external power supplies Vdd and Vss in the same manner as in the above Example (See FIG. 8).

Example 2

Figure 9:
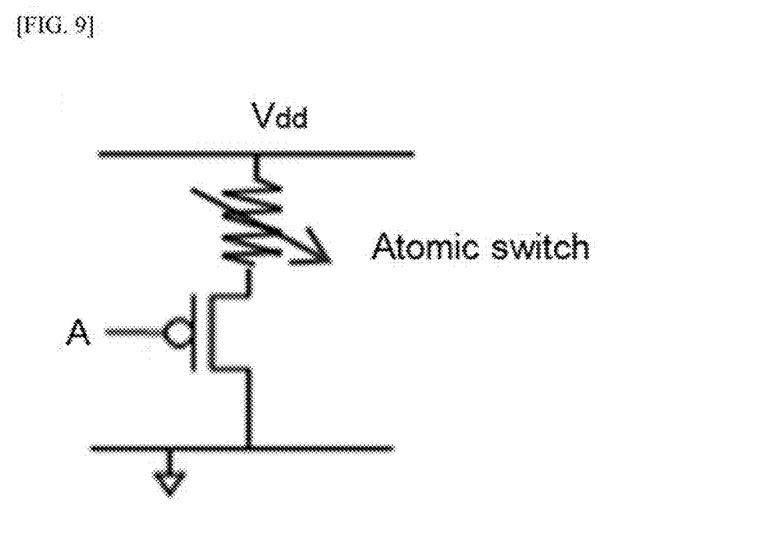
FIG. 9 is a diagram showing a circuit diagram in which an atomic switching element is integrated in a Vdd via interconnection of an N-MOSFET according to Example 2 of the present disclosure.

An atomic switching element was integrated in a Vdd via interconnection of a N-MOSFET formed in a lower portion of a three-dimensional monolithic circuit, that is, in a first channel layer (See FIG. 9).

Experimental Example 1

A current-voltage switching curve of the via integrated atomic switching unit cell element according to Example 1 was measured. The results are shown in FIG. 10.

Figure 10:
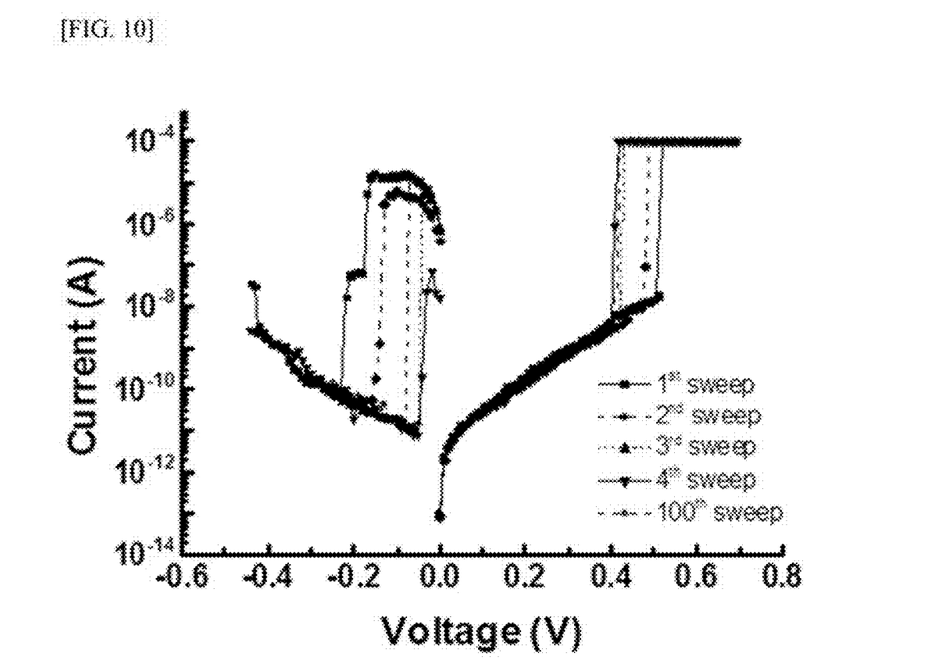
FIG. 10 is a graph showing a current-voltage curve of a via integrated atomic switching unit cell element of Example 1.

Referring to FIG. 10, a rapid rise of the current appears at about 0.4 V. Thus, it may be confirmed that a switch-on operation is performed. A switch-off operation in which the current drops rapidly at a negative voltage occurs.

Further, an on/off current ratio as a ratio of a current value at an on operation and a current value at an off operation was measured as $10^4$ ($10^{-4}/10^{-8}$).

Experimental Example 2

Figure 11:
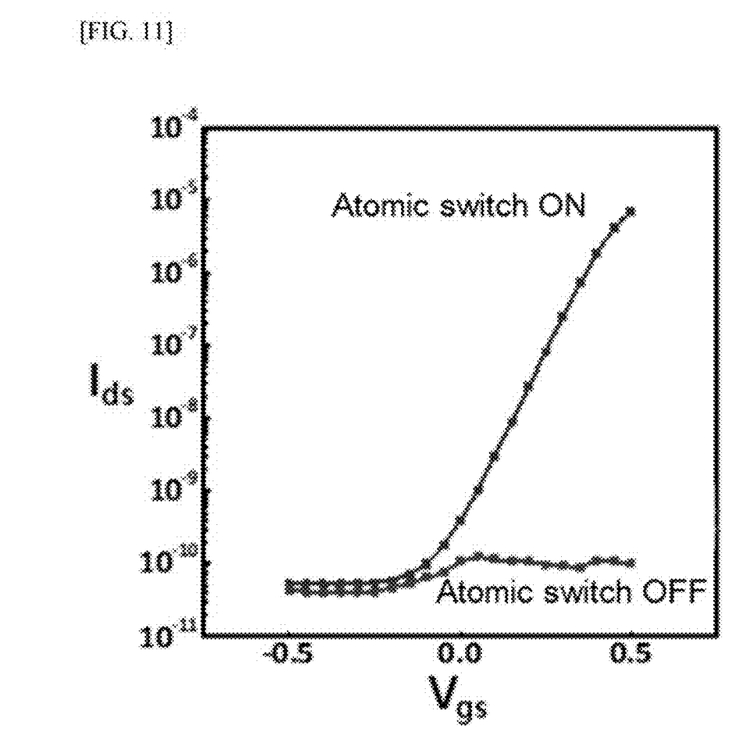
FIG. 11 is a graph showing a FET transfer curve according to on/off of an atomic switching element of Example 2.

FIG. 11 shows the switching characteristics of a transfer curve that varies based on a gate voltage applied to a lower N-MOSFET when the atomic switching element of Example 2 is turned on.

As shown in FIG. 11, when the atomic switching element is tuned off, the off state of the N-MOSFET is maintained even after Vth.

Experimental Example 3

In a comparative example, a 21 stage ring oscillator in which the atomic switching element is not integrated was prepared.

Then, the power consumptions of Example 1 and Comparative Example were measured. In this connection, the power measurement was based on an I (rms) value per each voltage level of each of the power supplies. The power consumption was calculated based on a following equation 1.

$$P = I\,(\mathrm{rms}) \times Vdd \qquad (1)$$

As a result, in the Comparative Example in which the atomic switching element was not integrated, the power consumption was $4.3 \times 10^{-2}$ W. When the atomic switching element of Example 1 in which atomic switching element was integrated was tuned off, power consumption thereof was $1.6 \times 10^{-3}$ W.

Therefore, in the circuit according to an implementation of the present disclosure, the power consumption is significantly reduced, compared to that in the Comparative Example.

Experimental Example 4

The circuits according to Example 1 and Comparative Example were subjected to PSPICE simulation. The results are shown in FIG. 12.

Figure 12:
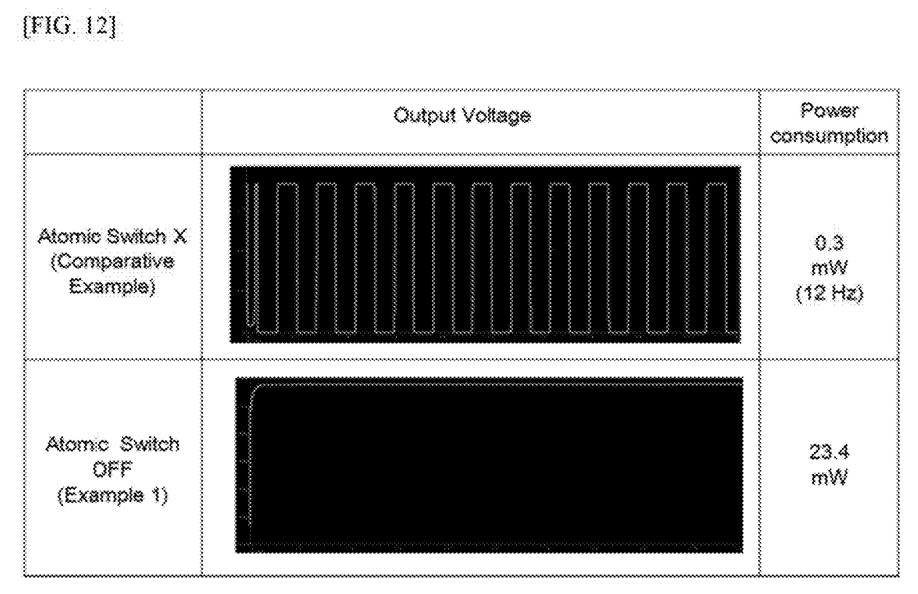
FIG. 12 is a diagram showing PSPICE simulation results of atomic switching elements of Example 1 and Comparative Example, respectively.

Referring to FIG. 12, in the Comparative Example, the power consumption of 3×10$^{-4}$ W was calculated. In Example 1, when the atomic switching element was turned off, the power consumption of 2.34×10$^{-8}$ W was calculated.

From the above results, it may be identified that in the circuit according to Example of the present disclosure, the power consumption is significantly reduced compared to that of the Comparative Example.

Experimental Example 5

Figure 13A:
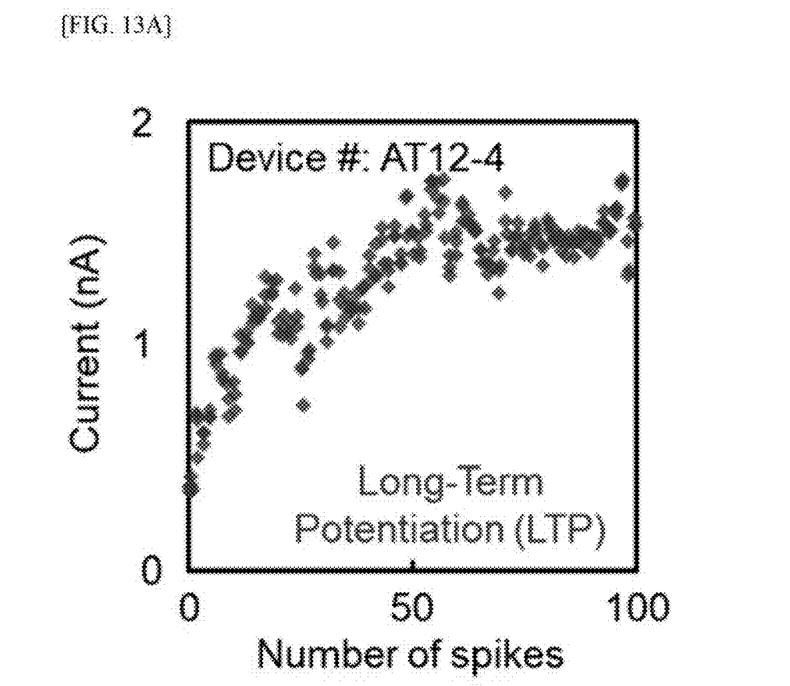
FIGS. 13A and 13B are graphs showing neuromorphic synapse characteristics (Long Term Potentiation and Long Term Depression) of a via-integrated atomic switching element in accordance with Example 1.
Figure 13B:
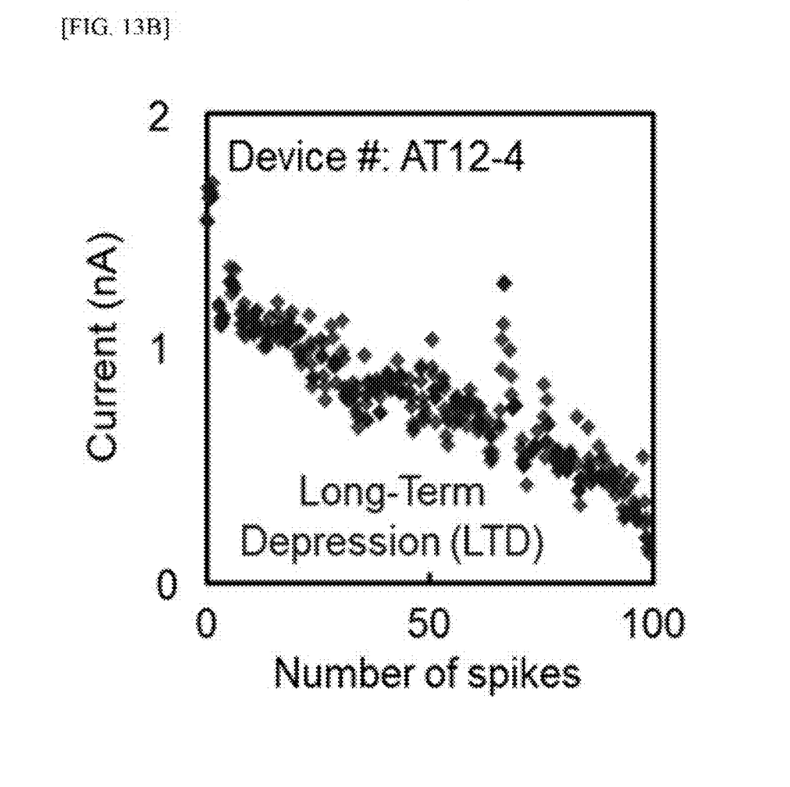
Figure 14:
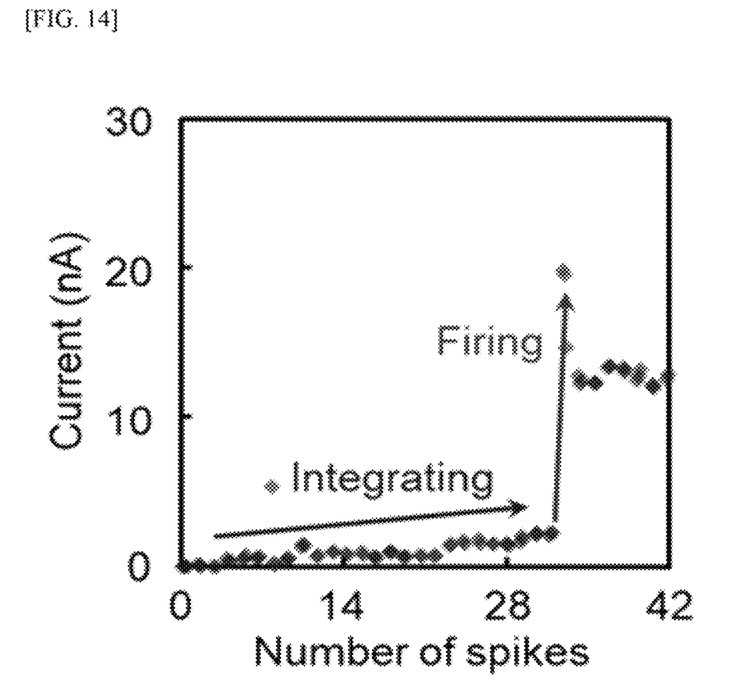
FIG. 14 is a graph showing neuromorphic neuron characteristics (Integrating & Firing) of a via-integrated atomic switching element in accordance with Example 1.

FIGS. 13A and 13B are graphs showing neuromorphic synapse characteristics (Long Term Potentiation and Long Term Depression) of a via-integrated atomic switching element in accordance with Example 1 and FIG. 14 is a graph showing neuromorphic neuron characteristics (Integrating & Firing) of a via-integrated atomic switching element in accordance with Example 1.

Referring FIGS. 13A and 13B, when 0.5 V pulse voltage is consistently applied to an upper electrode of the atomic switching element, it is observed that the device according the Example 1 has a synapse long-term potentiation (LTP) characteristic which means that the conductivity is increased as the number of the pulse increases, and when −0.5 V pulse voltage is consistently applied to the upper electrode of the atomic switching element, it is observed that the device according the Example 1 has a synapse long-term depression (LTD) characteristic which means that the conductivity is decreased as the number of the pulse increases. A dynamic range which is a ratio ($G_{max}/G_{min}$) of the maximum value of the conductivity to the minimum value of the conductivity is 14.

Referring FIG. 14, when a positive pulse voltage is applied to the upper electrode of the atomic switching element, the device according the Example 1 has a neuron integrating operation, which means that the change of the conductivity is ignored until 30 pulses are applied to the upper electrode of the atomic switching element, and a neuron firing operation, which means that the conductivity is rapidly increased when number of pulse more than 30 are applied to the upper electrode of the atomic switching element.

It will be understood that although the above disclosure has been described with reference to the preferred embodiment of the present disclosure, those skilled in the art may achieve modifications and changes thereto within a range that does not deviate from the spirit and scope of the present disclosure as described in the following claims.

What is claimed is:

1. A three-dimensional semiconductor integrated circuit comprising:
 a first complementary metal-oxide semiconductor (CMOS) circuit layer comprising a plurality of first CMOS circuit blocks;
 an insulating layer disposed on a top of the first CMOS circuit layer;
 a plurality of atomic switching elements respectively disposed inside via holes extending through the insulating layer, wherein the plurality of atomic switching elements are electrically connected to the plurality of first CMOS circuit blocks, respectively;
 a driver circuit layer disposed on a top of the insulating layer, and electrically connected with the plurality of atomic switching elements, wherein the driver circuit layer comprises a driver circuit for selectively turning on and off the plurality of atomic switching elements; and
 a second CMOS circuit disposed on a top of the driver circuit layer and connected to the atomic switching elements.

2. The three-dimensional semiconductor integrated circuit of claim 1, wherein the driver circuit comprises:
 a driving voltage generator for generating a voltage for turning on and off at least one atomic switching element; and
 a selector for selectively electrically connecting the at least one atomic switching element to the driving voltage generator.

3. The three-dimensional semiconductor integrated circuit of claim 2, wherein the driver circuit further comprises a selection information receiver for receiving selection information, for selecting the at least one atomic switching element, from an external component and for providing the selection information to the selector.

4. The three-dimensional semiconductor integrated circuit of claim 1, wherein each of the plurality of atomic switching elements comprise:
 a non-active electrode made of a first metal;
 an active electrode spaced from and opposite to the non-active electrode, wherein the active electrode is made of a second metal having lower ionization energy than ionization energy of the first metal; and
 a solid electrolyte layer disposed between the non-active electrode and the active electrode.

5. The three-dimensional semiconductor integrated circuit of claim 4, wherein the solid electrolyte layer is deposited in a form of a thin film on an inner face of the via hole.

6. The three-dimensional semiconductor integrated circuit of claim 4, wherein the first metal comprises at least one selected from a group consisting of platinum (Pt), palladium (Pd), titanium nitride (TiN), and tungsten (W).

7. The three-dimensional semiconductor integrated circuit of claim 4, wherein the second metal comprises at least one selected from a group consisting of copper (Cu), silver (Ag), and aluminum (Al).

8. The three-dimensional semiconductor integrated circuit of claim 4, wherein the solid electrolyte layer is made of at least one selected from a group consisting of tantalum pentoxide ($Ta_2O_5$), aluminum oxide ($Al_2O_3$), and hafnium oxide ($HfO_2$).

9. A power gating semiconductor device comprising the three-dimensional integrated circuit of claim 1.

10. A neuromorphic semiconductor device comprising the three-dimensional integrated circuit of claim 1.

11. A three-dimensional semiconductor integrated circuit comprising:
 a first complementary metal-oxide semiconductor (CMOS) circuit block;
 an insulator disposed on a top of the first CMOS circuit block;
 an atomic switching element disposed inside a via hole extending through the insulator and electrically connected to the first CMOS circuit block;
 a driver circuit, disposed on a top of the insulator, configured to selectively turn the atomic switching element on and off; and
 a second CMOS circuit disposed on a top of the driver circuit and connected to the atomic switching element.

12. The three-dimensional semiconductor integrated circuit of claim 11, wherein the atomic switching element comprises:
 a non-active electrode made of a first metal;
 an active electrode spaced from and opposite to the non-active electrode, wherein the active electrode is made of a second metal having lower ionization energy than ionization energy of the first metal; and a solid electrolyte layer disposed between the non-active electrode and the active electrode.

\* \* \* \* \*